United States Patent [19]
Takeuchi et al.

[11] Patent Number: 5,512,793
[45] Date of Patent: Apr. 30, 1996

[54] PIEZOELECTRIC AND/OR ELECTROSTRICTIVE ACTUATOR HAVING DUMMY CAVITIES WITHIN CERAMIC SUBSTRATE IN ADDITION TO PRESSURE CHAMBERS, AND DISPLACEMENT ADJUSTING LAYERS FORMED ALIGNED WITH THE DUMMY CAVITIES

[75] Inventors: Yukihisa Takeuchi, Miyoshi; Koji Kimura, Nagoya, both of Japan

[73] Assignee: NGK Insulators, Ltd., Japan

[21] Appl. No.: 382,580

[22] Filed: Feb. 2, 1995

[30] Foreign Application Priority Data

Feb. 4, 1994 [JP] Japan ................... 6-012830

[51] Int. Cl.⁶ ................ B41J 2/03; H01L 41/09
[52] U.S. Cl. ............. 310/328; 310/330; 310/331; 347/68
[58] Field of Search ................ 310/328, 330, 310/331, 345; 347/68

[56] References Cited

U.S. PATENT DOCUMENTS

| | | | |
|---|---|---|---|
| 4,680,595 | 7/1987 | Cruz-Uribe et al. | 346/140 R |
| 4,686,539 | 8/1987 | Schmidle et al. | 346/1.1 |
| 4,730,197 | 3/1988 | Raman et al. | 346/140 R |
| 5,245,244 | 9/1993 | Takahashi et al. | 310/328 |
| 5,376,856 | 12/1994 | Takeuchi et al. | 310/328 |
| 5,430,344 | 7/1995 | Takeuchi et al. | 310/330 |

FOREIGN PATENT DOCUMENTS

| | | | |
|---|---|---|---|
| 0572230 | 12/1993 | European Pat. Off. | B41J 2/14 |
| 0613196 | 8/1994 | European Pat. Off. | H01L 41/09 |
| 5-246025 | 9/1993 | Japan | B41J 2/046 |
| 5-261918 | 10/1993 | Japan | B41J 2/045 |

*Primary Examiner*—Thomas M. Dougherty
*Attorney, Agent, or Firm*—Parkhurst, Wendel & Burr

[57] ABSTRACT

A piezoelectric and/or electrostrictive actuator including a ceramic substrate and piezoelectric and/or electrostrictive elements is disclosed. The ceramic substrate includes: a spacer plate having a plurality of windows which provide pressure chambers, the windows being formed in a row in the longitudinal direction of the spacer plate; a closure plate superposed on one of opposite major surfaces of the spacer plate so as to close one of opposite openings of each window; and a connecting plate superposed on the other major surface of the spacer plate so as to close the other opening of each window. The piezoelectric and/or electrostrictive elements are disposed on respective portions of the outer surface of the closure plate in alignment with the respective pressure chambers. The spacer plate has auxiliary windows formed adjacent to respective two outermost windows which are located at opposite ends of the row, the auxiliary windows providing dummy cavities within the ceramic substrate such that the dummy cavities are formed adjacent to respective two outermost pressure chambers, while displacement adjusting layers are integrally formed on respective portions of the outer surface of the closure plate which correspond to the auxiliary windows giving the dummy cavities.

17 Claims, 5 Drawing Sheets

5,512,793

PIEZOELECTRIC AND/OR ELECTROSTRICTIVE ACTUATOR HAVING DUMMY CAVITIES WITHIN CERAMIC SUBSTRATE IN ADDITION TO PRESSURE CHAMBERS, AND DISPLACEMENT ADJUSTING LAYERS FORMED ALIGNED WITH THE DUMMY CAVITIES

BACKGROUND OF THE INVENTION

1. Field of the Invention

The present invention relates in general to a piezoelectric and/or electrostrictive actuator (hereinafter referred to as "P/E actuator"), and more particularly to a uni-morph, bi-morph or other types of P/E actuators or actuator units having a plurality of piezoelectric and/or electrostrictive elements (hereinafter referred to as "P/E elements") formed on a ceramic substrate thereof. The present invention is concerned with such P/E actuators or actuator units which undergo flexural displacement upon actuation of the P/E elements and which are used as ink pumps of an ink jet print head.

2. Discussion of the Related Art

As a means for raising a pressure in a pressure chamber formed within a ceramic substrate of an actuator unit, there is recently known a P/E element formed on a wall partially defining the pressure chamber so as to change a volume of the pressure chamber due to displacement of the P/E element. Such a piezoelectric and/or electrostrictive actuator unit may be used for each of a plurality of ink pumps of a print head of an ink jet printer, for example. To effect printing by the print head, an ink material is supplied to the pressure chamber to fill the same, and the level of ink pressure within the pressure chamber is raised due to displacement of the P/E element, so that a droplet of the ink is jetted through a nozzle communicating with the pressure chamber.

The assignee of the present invention proposed one example of ink jet print head, as disclosed in U.S. patent application Ser. No. 08/066,193 which employs the above-described P/E actuator unit. More specifically described, the proposed actuator unit has an actuator portion comprising: a ceramic substrate consisting of a plurality of ceramic green sheets which are superposed on each other and sintered into an integral laminar structure having pressure chambers therein; and a plurality of P/E elements each of which is formed by a film-forming method on an outer surface of a wall which partially defines the corresponding pressure chamber of the ceramic substrate. This actuator portion is bonded to a suitable ink nozzle member, thereby to provide an integral structure of the proposed actuator unit. Generally, an ink jet print head uses many actuator units arranged side by side.

Described in detail referring to FIGS. 5 and 6, an actuator portion generally indicated at 12 used in an ink jet print head comprises a ceramic substrate 14 obtained by integrally sintering a laminar structure of ceramic green sheets superposed on each other and a plurality of film-like P/E elements 16 formed on an outer surface of the ceramic substrate 14 by a film-forming method. The ceramic substrate 14 has a plurality of pressure chambers 18 formed therein which are aligned with the respective P/E elements 16. The thus constructed actuator portion 12 is bonded to an ink nozzle member indicated at 20 which includes a plurality of nozzles 22, ink discharge holes 24 and an ink supply channel 26. In operation, the ink material which is fed into the ink supply channel 26 is supplied to the pressure chambers 18 of the actuator portion 12 through respective through-holes 28. Upon actuation of the P/E elements 16, the upper walls of the pressure chambers 18 are deformed, thereby to raise the pressure of the ink within the pressure chambers 18. Then, the ink material within the pressure chambers 18 is jetted outwards from the appropriate nozzles 22 through the corresponding through-holes 29 of the ceramic substrate 14 and the corresponding ink discharge holes 24 of the ink nozzle member 20.

In an attempt to provide an ink jet print head which is capable of performing highly accurate and high-quality printing, a relatively large number of pressure chambers 18 are formed within the substrate 14 of the actuator portion 12 and arranged at a relatively small pitch, and a correspondingly large number of nozzles 22 are formed for effecting highly accurate and high-quality printing.

The ink jet print head employing the actuator portion 12 constructed as described above in each actuator unit thereof, however, has suffered from a problem in terms of the operating characteristics of the P/E elements 16. That is, among the plurality of P/E elements 16 which are formed in a row on the substrate 14 so as to be aligned with the respective pressure chambers 18, two outermost elements 16 which are located at the opposite ends of the row are inferior in the operating characteristics to the other or adjacent inner elements 16 interposed therebetween.

More specifically described, in the actuator unit 12 constructed as described above, the amount of flexural deformation of each P/E element 16 (the amount of flexural deformation of the upper wall of each pressure chamber 18) was measured by applying a suitable voltage to each of the elements 16. The result of the measurement showed that the amounts of flexural deformation of the above-indicated two outermost piezoelectric/electrostrictive elements 16 are smaller by about 30% than those of the other, inner elements 16 interposed therebetween. Thus, the two outermost elements do not undergo sufficiently large amounts of flexural deformation as compared with the inner elements. A variation or fluctuation in the amount of the flexural deformation or inconsistent operating characteristics of the P/E elements 16 of the actuator portion 12 undesirably causes inconsistency or fluctuation in the ink-jetting capability of the print head and deterioration of the quality of printed images produced by the print head, when the above-constructed actuator units are used as ink pumps for the ink jet print head.

As a result of a further study by the inventors of the present invention, there was proposed a P/E actuator as disclosed in U.S. Pat. No. 5,376,856 in an attempt to solve the above-described problem, wherein the actuator portion of each actuator unit has two dummy cavities or enclosed spaces within the substrate formed adjacent to respective two outermost pressure chambers which are located at opposite ends of a row of the pressure chambers, such that the two dummy cavities sandwich the row of pressure chambers. In this arrangement, the rigidity of the substrate at the two outermost pressure chambers located at opposite ends of the row is effectively reduced due to the existence of the dummy cavities, whereby the two outermost chambers are more likely to be deformed, and therefore, the two outermost P/E elements corresponding to the two outermost pressure chambers exhibit improved operating characteristics which are substantially equal to those of the other inner elements interposed between the two outermost elements.

However, in the above actuator portion which is provided with the above-described dummy cavities formed adjacent to the two outermost pressure chambers, the size and configuration of the dummy cavities must be suitably selected for enabling the two outermost P/E elements corresponding to the two outermost pressure chambers to exhibit the operating characteristics substantially equal to those of the inner elements sandwiched by and between the two outermost elements. Usually, the selection or adjustment of the size and configuration of the dummy cavities must be effected by trial-and-error depending upon the operating characteristics of the P/E elements of each actuator portion. As a result, there arises a problem that it takes a lot of time and cost to initially design the actuator portion and subsequently modify the design of the actuator portion. In particular, where windows which give the pressure chambers and dummy cavities are formed by punching off the corresponding portions of a green sheet which constitutes a part of the ceramic substrate, various kinds of metal molds used for punching operation must be prepared in order to obtain the dummy cavities having desired sizes and configurations for permitting the two outermost P/E elements to exhibit improved operating characteristics. The preparation of the metal molds requires considerable cost and time, undesirably pushing up the manufacturing cost of the actuator portion of the actuator unit.

SUMMARY OF THE INVENTION

It is therefore an object of the present invention to provide a piezoelectric and/or electrostrictive (P/E) actuator which includes a ceramic substrate having a plurality of pressure chambers formed in a row extending in its longitudinal direction, and a plurality of piezoelectric and/or electrostrictive (P/E) elements formed in a row on the outer surface of the ceramic substrate in alignment with the respective pressure chambers, wherein the operating characteristics of the two outermost P/E elements which are located at opposite ends of the row are effectively improved, so that all of the P/E elements of the actuator exhibit excellent operating characteristics. It is also an object of the invention to provide such a P/E actuator which permits simplified design and which can be produced with improved efficiency at a significantly reduced cost.

The above object may be accomplished according to the principle of the present invention which provides a piezoelectric and/or electrostrictive actuator comprising (a) a ceramic substrate in which pressure chambers are formed in a row extending in a longitudinal direction of the substrate, the ceramic substrate including a spacer plate having a plurality of windows which provide the pressure chambers, the plurality of windows being formed in a row extending in a longitudinal direction of the spacer plate, a closure plate superposed on one of opposite major surfaces of the spacer plate so as to close one of opposite openings of each of the windows, and a connecting plate superposed on the other major surface of the spacer plate so as to close the other opening of each of the windows, the spacer plate, the closure plate and the connecting plate being formed from respective ceramic green sheets which are laminated on each other and fired into an integral structure as the ceramic substrate, and (b) piezoelectric and/or electrostrictive elements which are disposed on respective portions of an outer surface of the closure plate which partially define the pressure chambers, respectively, the elements being energized to cause deformation of the respective portions, so as to change pressure levels of the corresponding pressure chambers, each of the piezoelectric and/or electrostrictive elements comprising a lower electrode, a piezoelectric and/or electrostrictive layer and an upper electrode which are formed in the order of description by a film-forming method on the outer surface of the closure plate in alignment with the respective pressure chambers, wherein the spacer plate has auxiliary windows having a predetermined size formed adjacent to respective two outermost windows which are located at opposite ends of the row of the plurality of windows of the spacer plate, the auxiliary windows providing dummy cavities within the ceramic substrate such that the dummy cavities are formed adjacent to respective two outermost pressure chambers which are located at opposite ends of the row of the pressure chambers, and wherein displacement adjusting layers having a suitable pattern are integrally formed on respective portions of the outer surface of the closure plate which are aligned with the auxiliary windows of the spacer plate.

In the piezoelectric and/or electrostrictive actuator constructed according to the present invention, the displacement adjusting layers are integrally formed by a film-forming method on the respective portions of the outer surface of the closure plate which are aligned with the auxiliary windows of the spacer plate.

According to a preferred form of the present invention, each of the displacement adjusting layers includes at least one layer which is similar to the lower electrode and/or the piezoelectric and/or electrostrictive layer. The displacement adjusting layers may be formed on the respective portions of the outer surface of the closure plate, at the same time when the piezoelectric and/or electrostrictive elements are formed on the closure plate. The displacement adjusting layers may include an insulating resin layer made of an electrically insulating resin material.

In the piezoelectric and/or electrostrictive actuator constructed according to the present invention, a plurality of pressure chambers corresponding to the respective windows are formed within the ceramic substrate in a row extending in the longitudinal direction of the substrate, while dummy cavities or enclosed spaces corresponding to the respective auxiliary windows having a suitable size are also formed within the substrate, such that the dummy cavities are formed adjacent to the respective two outermost pressure chambers which are located at the opposite ends of the row of the pressure chambers so as to sandwich the plurality of the pressure chambers therebetween. According to this arrangement, the rigidity of the substrate at the above-indicated two outermost pressure chambers is effectively lowered due to the existence of the dummy cavities, whereby the two outermost pressure chambers are more likely to be deformed. Moreover, in the present actuator, the displacement adjusting layers having a suitable pattern are integrally formed on the respective portions of the outer surface of the closure plate which are aligned with the auxiliary windows giving the dummy cavities. The provision of the displacement adjusting layers according to the present invention effectively permits precise and fine adjustment of the rigidity at the two outermost pressure chambers located adjacent to the respective dummy cavities.

Described in detail, the rigidity at the above-indicated two outermost pressure chambers can be adjusted by varying the size of the auxiliary windows which give the dummy cavities. That is, the degree of lowering of the rigidity can be controlled by changing the size of the auxiliary windows. On the other hand, the formation of the displacement adjusting layers integrally on the ceramic substrate according to the present invention leads to an increase in the rigidity at the two outermost pressure chambers which has been lowered by the provision of the dummy cavities. Further, the degree of increase in the rigidity of these chambers can be adjusted by suitably determining the pattern of the displacement adjusting layers to be formed on the substrate. Accordingly, the rigidity at the two outermost pressure chambers can be controlled as desired by suitably selecting the pattern (size, shape, thickness, etc.) of the displacement adjusting layers, in addition to the selection of the size of the auxiliary windows which give the dummy cavities. Since the rigidity at the two outermost pressure chambers can be properly adjusted by the provision of the displacement adjusting layers of the present invention, the two outermost pressure chambers undergo the substantially same amount of deformation as the inner chambers interposed between the two outermost chambers, upon actuation of the corresponding piezoelectric and/or electrostrictive elements, permitting all the piezoelectric and/or electrostrictive elements including the two outermost elements corresponding to the two outermost chambers to exhibit excellent and stable operating characteristics.

Therefore, when the actuator portion constructed as described above is used in each of the actuator units or ink pumps for an ink jet print head, for example, the ink jet print head assures excellent ink-jetting capability owing to the improved operating characteristics of the piezoelectric and/or electrostrictive elements. Thus, the ink jet print head using the piezoelectric and/or electrostrictive actuator wherein each actuator unit has the above-constructed actuator portion is capable of producing improved quality of printed images with high stability.

According to the present invention, the rigidity of the ceramic substrate at the two outermost pressure chambers located at opposite ends of the row of the chambers can be adjusted by the provision of the displacement adjusting layers formed integrally on the ceramic substrate, in addition to the provision of the dummy cavities partially defined by the respective auxiliary windows. In this arrangement, the auxiliary windows which give the dummy cavities are formed with suitable dimensions in the spacer plate of the ceramic substrate, so that the rigidity at the two outermost pressure chambers located adjacent to the respective dummy cavities is lowered due to the existence of the dummy cavities. The thus lowered rigidity can be adjusted as desired by providing suitably patterned displacement adjusting layers on the ceramic substrate. That is, though the provision of the displacement adjusting layers result in raising the rigidity at the two outermost chambers, the degree of rise in the rigidity can be properly and precisely controlled by the selection of the pattern of the displacement adjusting layers so as to obtain the desired rigidity. This arrangement allows effective adjustment of the rigidity at the two outermost pressure chambers with high accuracy. Since the rigidity can be adjusted as desired by suitably selecting the pattern of the displacement adjusting layers in the present invention, the manufacturing cost of the present actuator is considerably lowered as compared to the conventional actuator wherein the rigidity at the two outermost pressure chambers is controlled by varying the configuration and dimensions of the auxiliary windows by using various kinds of the metal molds for punching operation. In this arrangement, the time and cost required for changing the pattern of the displacement adjusting layers can be effectively reduced. Therefore, this arrangement permits fast and economical design of the piezoelectric and/or electrostrictive actuator and modification of design thereof.

BRIEF DESCRIPTION OF THE DRAWINGS

The above and optional objects, features and advantages of the present invention will be better understood by reading the following detailed description of a presently preferred embodiment of the invention, when considered in connection with the accompanying drawings, in which.

DETAILED DESCRIPTION OF THE PREFERRED EMBODIMENT

Figure 1:
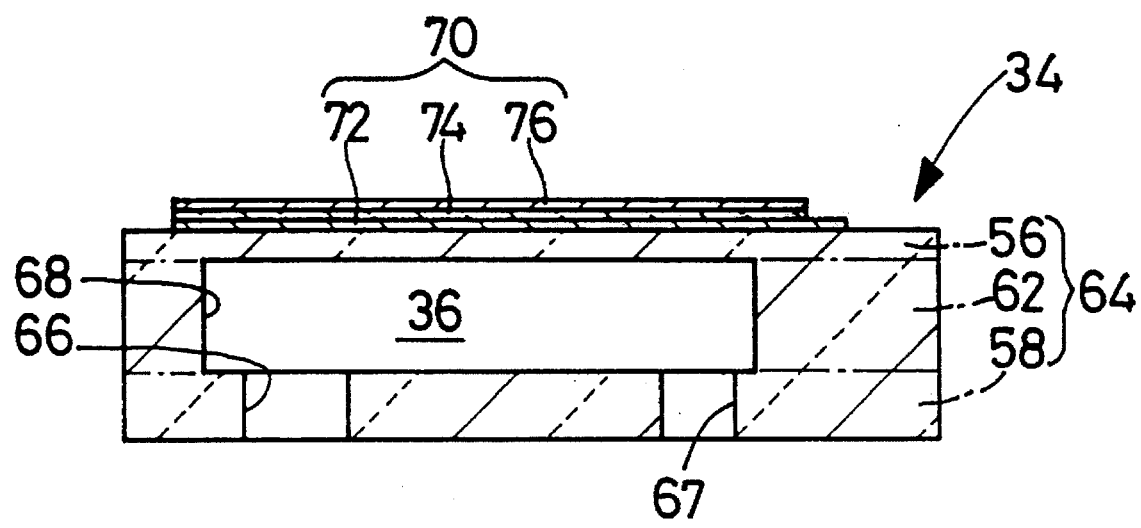
FIG. 1 is an elevational view in vertical cross section, showing a piezoelectric and/or electrostrictive actuator portion of an actuator unit according to one embodiment of the present invention.

Referring first to FIG. 1 schematically showing a piezoelectric and/or electrostrictive actuator portion 34 (hereinafter referred to as "P/E actuator portion") of an actuator unit according to one embodiment of the present invention, and to FIG. 2 which is an exploded perspective view of the actuator portion 34, the P/E actuator portion 34 includes a ceramic substrate 64 consisting of a closure plate 56, a spacer plate 62, and a connecting plate 58 each having a relatively small thickness and formed of a ceramic material. These plates 56, 62, 58 are superposed on each other to provide an integral structure of the ceramic substrate 64. The actuator portion 34 further includes a plurality of film-like piezoelectric and/or electrostrictive elements 70 (hereinafter referred to as "P/E elements") formed on the outer surface of the closure plate 56. In operation, the P/E elements 70 undergo contraction upon application of a voltage thereto, and consequently, the closure plate 56 as well as the P/E elements 70 are subject to displacement in the form of bending or flexure. The displacement causes deformation or strain of appropriate pressure chambers 36 formed within the ceramic substrate 64, so that a pressure level in each of the pressure chambers 36 is changed.

Figure 2:
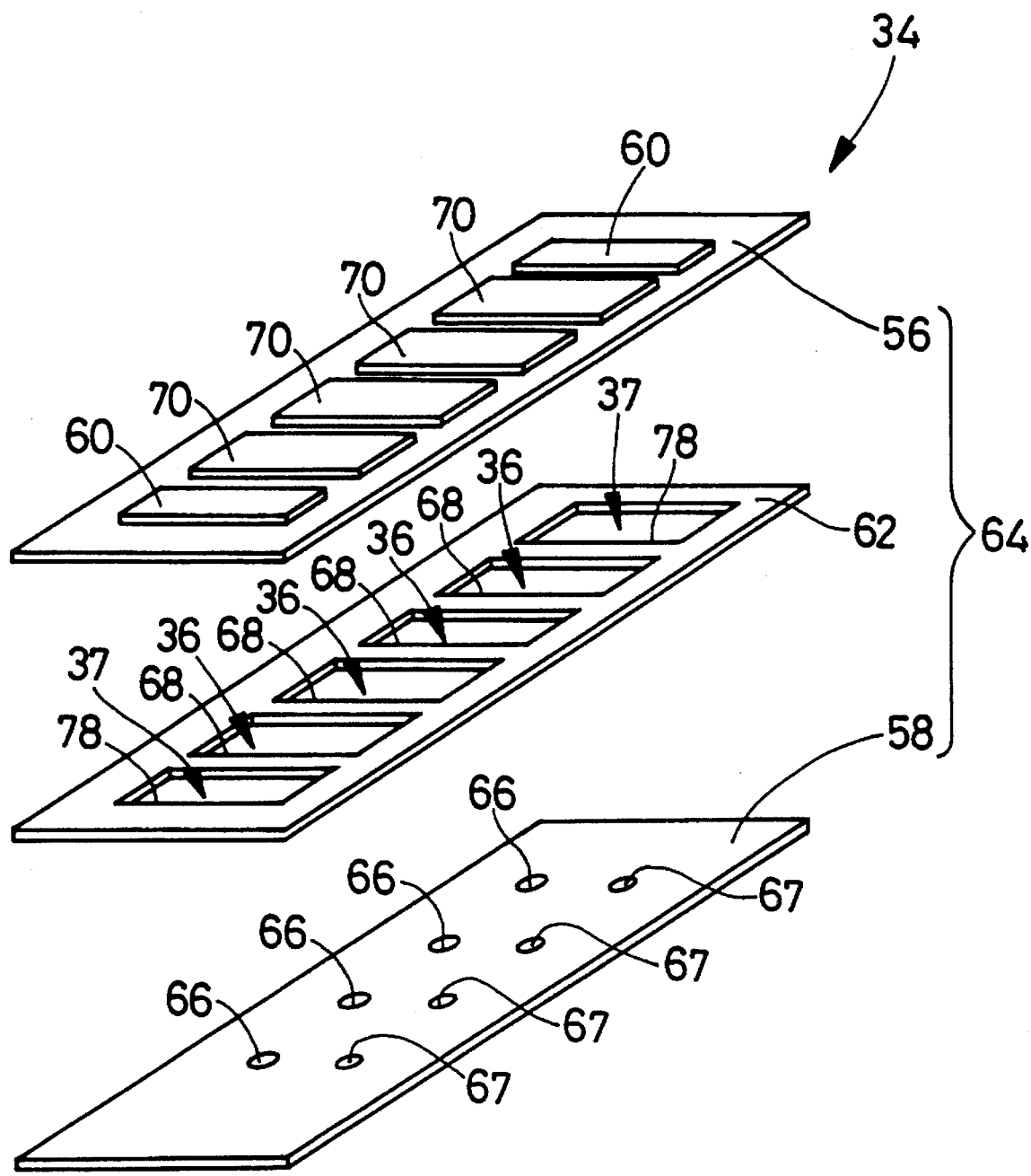
FIG. 2 is an exploded perspective view showing the structure of the piezoelectric and/or electrostrictive actuator portion of FIG. 1.

More specifically described referring to FIG. 2, the spacer plate 62 of the ceramic substrate 64 has four inner rectangular windows 68 formed through the thickness thereof. The four inner windows 68 are formed in a row in equally spaced-apart relation with each other in the longitudinal direction of the spacer plate 62, as viewed in a plane of the spacer plate 62. The spacer plate 62 further has two auxiliary or outer windows 78, 78 each having predetermined configuration and dimensions. In this embodiment, each of the auxiliary windows 78 has substantially the same configuration and dimensions as those of the windows 68. The auxiliary windows 78, 78 are formed adjacent to respective two outermost ones of the inner windows 68, which are located at opposite ends of the row of the four inner windows 68, such that the auxiliary windows 78 sandwich the four inner windows 68 therebetween. The connecting plate 58 of the ceramic substrate 64 has four pairs of first and second communication holes 66, 67 formed through the thickness thereof. Each pair of the first and second communication holes 66, 67 is aligned with the corresponding one of the inner windows 68, as viewed in a plane of the connecting plate 58.

The connecting plate 58 is bonded to one of opposite major surfaces of the spacer plate 62 (more precisely, the lower surface of the spacer plate 62 as seen in FIG. 2), and the closure plate 56 is bonded to the other major surface of the spacer plate 62 (more precisely, the upper surface of the spacer plate 62 as seen in FIG. 2). The superposed plates 56, 58, 62 are fired into an integral structure of the ceramic substrate 64. In the thus formed ceramic substrate 64, the four inner windows 68 and the two auxiliary or outer windows 78 of the spacer plate 62 are closed at opposite openings thereof by the closure plate 56 and the connecting plate 58. According to this arrangement, four pressure chambers 36 are formed within the ceramic substrate 64 in alignment with the respective four inner windows 68, such that the pressure chambers 36 are arranged in a row extending in the longitudinal direction of the ceramic substrate 64, as viewed in a plane of the substrate 64. Each of the pressure chambers 36 is held in communication with exterior space through the corresponding pair of the first and second communication holes 66, 67. Further, in the above-constructed ceramic substrate 64, two dummy cavities or enclosed spaces 37, 37 corresponding to the two auxiliary windows 78, 78 are formed adjacent to the two outermost pressure chambers of the four pressure chambers 36, such that the two dummy cavities 37 sandwich the four pressure chambers 36 therebetween. The dummy cavities 37 have suitably designed dimensions and configuration, e.g., substantially the same volume as the pressure chambers 36, in this embodiment.

The ceramic substrate 64 as described above has an integral fired ceramic structure formed in the following manner. Initially, a ceramic slurry is prepared from ceramic materials, binders, liquid solvents and other materials, and the thus prepared ceramic slurry is formed into green sheets by means of a generally used device such as a doctor blade device or a reverse roll coater. Then, the obtained green sheets are subjected to suitable mechanical machining operation or laser machining operation such as cutting, machining or punching, as needed, to form the windows 68, auxiliary windows 78, and first and second communication holes 66, 67. Thus, there are formed precursors for the plates 56, 58, 62. These precursors are then laminated on each other and co-fired into the integral structure of the ceramic substrate 64. The thus formed ceramic substrate 64 assures complete and secure sealing between the adjacent plates 56, 58, 62, without applying any bonding adhesive to their interfaces.

For establishing more stable sealing between the plates 56, 58, 62, it is preferable to print or coat a slurry or paste formed of the same material as the slurry of the green sheets, at the interfaces of the green sheets for the plates 56, 58, 62 before firing, thereby to form surface layers at the interfaces of the green sheets. The thus formed surface layers are softer than the green sheets, and therefore, are likely to be spread over the entire surfaces of the green sheets under a pressure when the green sheets for the plates 56, 58, 62 are laminated and pressed onto each other. Accordingly, the surface layers provide sufficient bonding strength and assure increased and stable sealing tightness at the interfaces of the plates 56, 58, 62 in the fired ceramic substrate 64.

Figure 4:
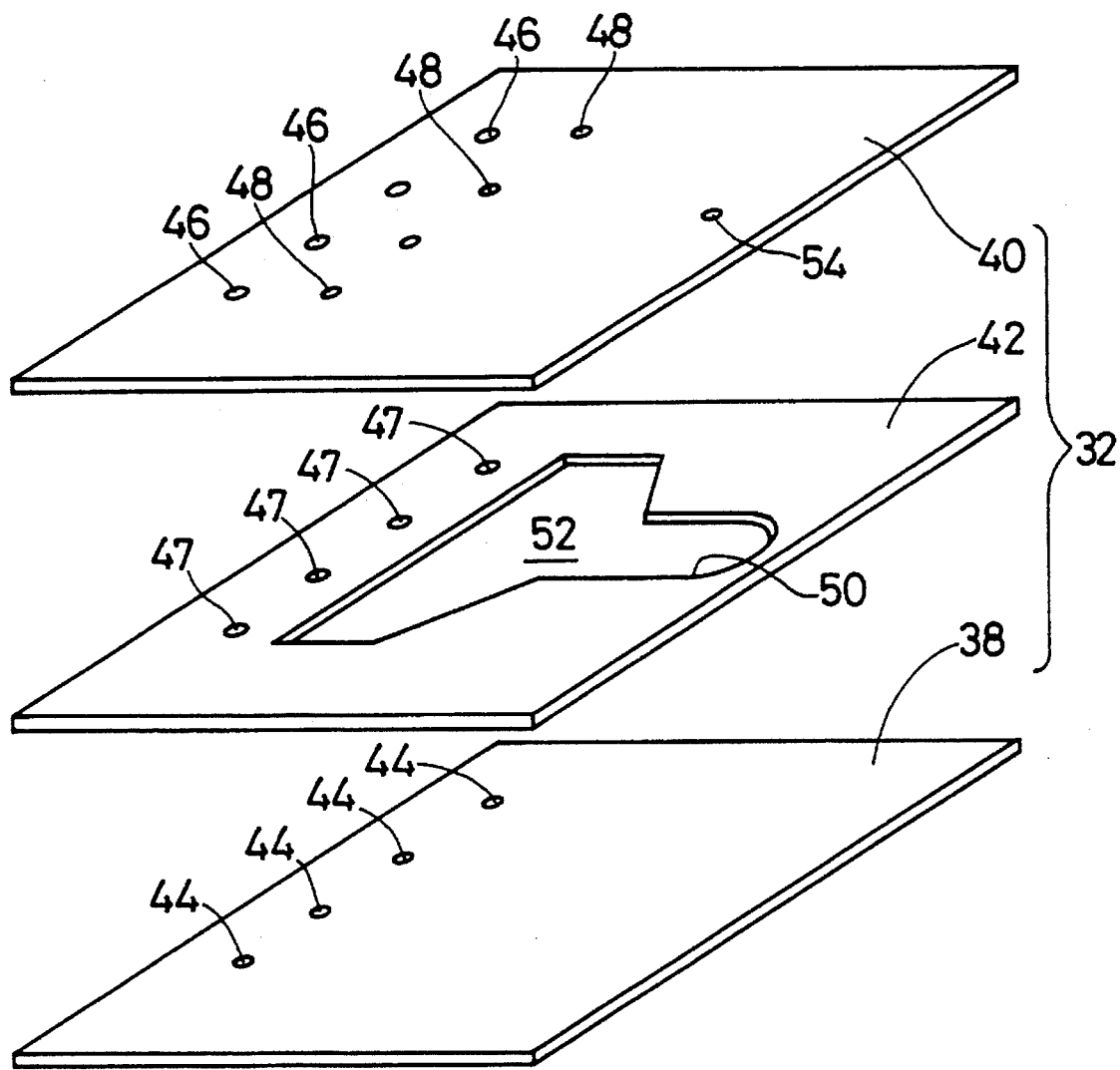
FIG. 4 is an exploded perspective view showing the structure of an ink nozzle member of the actuator unit of FIG. 3.
Figure 5:
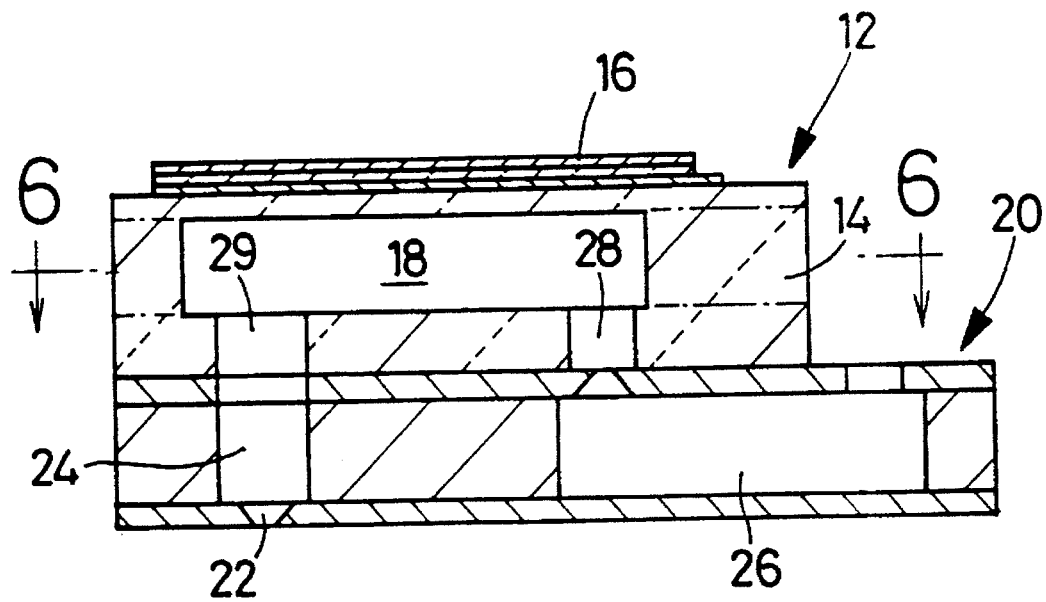
FIG. 5 is an elevational view in vertical cross section, showing one example of a conventional actuator unit used as an ink pump for an ink jet print head.
Figure 6:
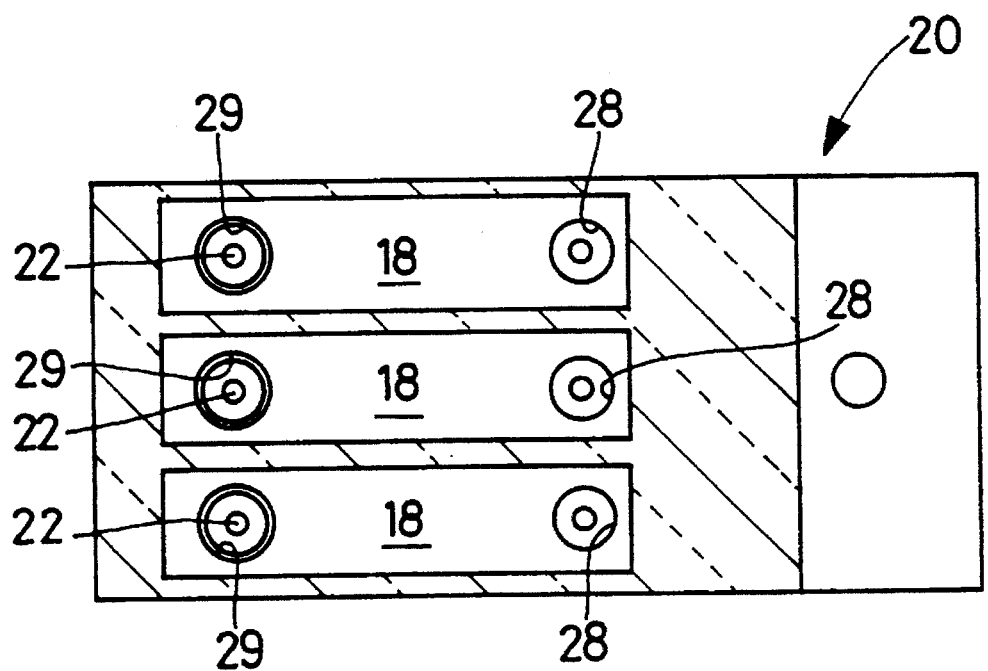
FIG. 6 is a cross sectional view taken along line 6—6 of FIG. 5.

In the ceramic substrate 64 constructed as described above, the pressure chambers 36 formed therein are brought into communication with the exterior space through the corresponding pairs of the first and second communication holes 66, 67 formed in the connecting plate 58. This arrangement of the ceramic substrate 64 is advantageous when the ceramic substrate 64 of the actuator portion 34 is bonded to an ink nozzle member 32 as shown in FIG. 4 or other component which will be described, since a sealing area between the ceramic substrate 64 and the ink nozzle member 32 which must be sealed fluid-tightly is considerably reduced, thereby assuring improved bonding efficiency. Further, the existence of the connecting plate 58 effectively improves structural or mechanical strength of the ceramic substrate 64, which favorably prevents warpage of the ceramic substrate 64 upon firing thereof and permits easy handling of the substrate 64 while the actuator portion 34 is manufactured or used in the ink jet print head. Since the dummy cavities 37 defined by the auxiliary windows 78, closure plate 56, and connecting plate 58 are air-tightly closed, there arises a pressure difference between the inside of the dummy cavities 37 and the exterior space because of a difference in temperature between the inside of the dummy cavities 37 and the exterior space, upon firing the ceramic substrate 64. This pressure difference will give an adverse influence on the ceramic substrate 64, in view of the structural strength thereof. Therefore, it is desirable to form suitable communication holes at the portions of the connecting plate 58 corresponding to the respective auxiliary windows 78, such that each of the dummy cavities 37 is brought into communication with the exterior space through the communication holes.

While the ceramic material for forming the ceramic substrate 64 is suitably selected from any known materials and it is not particularly limited, alumina, zirconia or the like may be favorably employed in view of its high formability and other desired properties. Further, the closure plate 56, connecting plate 58 and spacer plate 62 are favorably formed from green sheets having substantially the same ceramic composition and distribution of grain size, so as to achieve good sinterbility and matching of coefficients of the thermal expansion of the plates 56, 58, 62.

In the ceramic substrate 64 as described above, the thickness of the closure plate 56 is preferably 50 μm or smaller, more preferably, 20 μm or smaller, still more preferably, in a range of about 3–12 μm. The thickness of the spacer plate 62 is preferably 10 μm or larger, more preferably, 50 μm or larger. The thickness of the connecting plate 58 is preferably 30 μm or larger, more preferably, 50 μm or larger, still more preferably, 100 μm or larger.

The film-like P/E elements 70 each consisting of a lower electrode 72, piezoelectric and/or electrostrictive layer 74 (hereinafter referred to as "P/E layer") and an upper electrode 76 are formed by a film-forming method on the outer surface of the closure plate 56 in alignment with the respective pressure chambers 36. The electrode films (upper and lower electrodes 76, 72) and the P/E layer 74 are formed on the outer surface of the closure plate 56, by any one of various known film-forming methods which include thick-film forming techniques such as screen printing, spraying, dipping and coating, and thin-film forming techniques such as ion-beam method, sputtering, vacuum vapor deposition, ion plating, CVD and plating. The films and layer 72, 74, 76 may be formed either before or after firing of the closure plate 56 (the ceramic substrate 64). The upper and lower electrodes 76, 72 and the P/E layer 74 formed on the closure plate 56 may be heat-treated or fired as needed, either in different steps following formation of the respective films and layer 76, 72, 74, or concurrently in one step following formation of all of the films and layer 76, 72, 74.

The electrode films (upper and lower electrodes 76, 72) of each P/E element 70 may be formed of any electrically conductive material which can withstand a high-temperature oxidizing atmosphere generated upon the heat-treatment or firing as described above. For instance, the electrode films 76, 72 may be formed of a single metal, an alloy, a mixture of a metal or alloy and an electrically insulating ceramic or glass, or an electrically conductive ceramic. The P/E layer 74 of each P/E element 70 may be formed of any piezoelectric or electrostrictive material which produces a relatively large amount of strain or displacement due to the converse or reverse piezoelectric effect or the electrostrictive effect. The piezoelectric and/or electrostrictive material may be either a crystalline material or an amorphous material, and may be a semi-conductor material or a dielectric or ferroelectric ceramic material. Further, the piezoelectric and/or electrostrictive material may either require a treatment for initial polarization or poling, or may not require such a polarization treatment. Though the materials for forming the upper and lower electrodes 76, 72 and P/E layer 74 are suitably selected from any known materials, it is particularly preferable to employ materials as disclosed in JP-A-5-29675 and JP-A-5-270912 which correspond to U.S. patent application Ser. No. 07/912,920 assigned to the assignee of the present patent application.

The P/E element 70 constructed as described above generally has a thickness of not larger than 100 μm, preferably not larger than 60 μm. The thickness of each of the upper and lower electrode films 76, 72 is generally 20 μm or smaller, preferably 5 μm or smaller. To assure relatively large amount of displacement by application of a relatively low voltage, the thickness of the P/E layer 74 is preferably 50 μm or smaller, more preferably, in a range of 3–40 μm.

The P/E elements 70, which are supported by the closure plate 56 of the ceramic substrate 64, exhibit sufficiently high mechanical strength and toughness even though the elements 70 have a relatively small thickness. In addition, the film-forming method used for forming the electrode films 76, 72 and the P/E layer 74 permits a relatively large number of the P/E elements 70 to be formed on the closure plate 56. That is, in the film forming process as described above, the elements 70 can be concurrently and easily formed with a small spacing left between the adjacent ones, without using an adhesive or the like.

In the actuator portion 34 of the actuator unit 30 constructed according to the present invention, in addition to the P/E elements 70 formed on the outer surface of the closure plate 56 in a row extending in the longitudinal direction of the closure plate 56, the displacement adjusting layers 60, 60 having a predetermined pattern are integrally formed on the outer surface of the closure plate 56 so as to be aligned with the respective auxiliary windows 78 (dummy cavities 37). The displacement adjusting layers 60 are formed adjacent to the respective two outermost P/E elements 70 which are located at the opposite ends of the row of the elements 70. The provision of the displacement adjusting layers 60 raises the rigidity at the portions of the ceramic substrate 64 on which the displacement adjusting layers are formed, making it possible to suitably adjust the amount of deformation of the two outermost pressure chambers 36 which are located adjacent to the respective dummy cavities 37, upon the actuation of the corresponding two outermost P/E elements 70.

While the displacement adjusting layers 60 are formed by any one of various known methods, it is preferable to form the displacement adjusting layers 60 integrally on the outer surface of the closure plate 56 by the filmforming method as employed in forming the P/E elements 70, i.e., the upper electrode 72, P/E layer 74, and upper electrode 76. When the displacement adjusting layers 60 are formed by the filmforming method as described above, it is possible to form the displacement adjusting layers 60 concurrently with the formation of the P/E elements 70, reducing the manufacturing process and cost of the actuator to be produced, and permitting easier patterning of the displacement adjusting layers 60. These advantages offered by forming the displacement adjusting layers 60 concurrently with the formation of the P/E elements 70 are sufficiently obtained when each of the displacement adjusting layers 60 consists of at least one layer which is similar to the lower electrode 72 and/or the P/E layer 74. It is particularly preferable that each displacement adjusting layer 60 consist of layers similar to or identical with the lower electrode 72 and the P/E layer 74, or a laminar structure consisting of layers similar to or identical with the lower electrode 72, P/E layer 74, and upper electrode 76.

The displacement adjusting layers 60 may include an insulating resin layer formed of an electrically insulating resin material which is used for the purpose of electrically insulating adjacent P/E elements 70, 70 formed in a row on the outer surface of the closure plate 56. For instance, the displacement adjusting layers 60 may consist of only the insulating resin layer as described above. Alternatively, the adjusting layers 60 may have a laminar structure consisting of the insulating resin layer and at least one layer similar to the lower electrode 72, P/E layer 74 or upper electrode 76, which cooperate to give each of the P/E element 70. The insulating resin material for forming the insulating resin layer is not particularly limited provided that the material is an insulating resin having a predetermined hardness which permits application of the film-forming method such as screen printing when the insulating resin layer is formed on the outer surface of the closure plate 56. It is preferable that the material have Young's modulus in a range of 1 kg/mm$^2$–1000 kg/mm$^2$. In particular, a thermosetting resin such as acrylic resin or epoxy resin is preferably used as the material for the insulating resin layer. In view of the electrical insulating property and film formability of the insulating resin layer, various kinds of solder resist may be preferably used as the material for the insulating resin layer.

The displacement adjusting layers 60 constructed as described above are provided so as to adjust the rigidity at the two outermost pressure chambers 36 which has been lowered due to the presence of the auxiliary windows 78, i.e., the dummy cavities 37. Therefore, the pattern of the displacement adjusting layers 60 can be appropriately determined depending upon the lowered rigidity values at the two outermost pressure chambers 36. By varying the pattern of the displacement adjusting layers 60, it is possible to regulate the degree of increase in the rigidity at the two outermost pressure chambers 36. Accordingly, the displacement adjusting layers 60 cooperate with the dummy cavities 37 to adjust the amount of deformation of the two outermost pressure chambers 36 located adjacent to the respective dummy cavities 37. It is noted that the thickness of the displacement adjusting layers 60 influences the rigidity at the two outermost pressure chambers 36 to a certain extent. That is, the rigidity at the two outermost pressure chambers 36 increases with an increase in the thickness of the displacement adjusting layers 60. It is preferable that the thickness of each displacement adjusting layer 60 be not larger than 70 μm, more preferably, not larger than 50 μm. If the thickness of the displacement adjusting layer 60 is much larger than the preferred values as indicated above, the displacement adjusting layer 60 tends to suffer from cracking and may consequently be peeled off from the outer surface of the closure plate 56 while it is formed on the outer surface of the closure plate 56.

In the thus formed actuator portion 34 of the present invention, in addition to the four pressure chambers 36 (corresponding to the four inner windows 68) formed within the ceramic substrate 64 in a row extending in the longitudinal direction of the substrate 64, the two dummy cavities 37 which have predetermined configuration and dimensions and which are aligned with the auxiliary windows 78 are formed within the ceramic substrate 64 adjacent to the two outermost pressure chambers 36, such that the two dummy cavities 37 sandwich the four pressure chambers 36 therebetween. The provision of the dummy cavities 37 formed as described above is effective to reduce the rigidity at the two outermost pressure chambers 36. Further, in the above-constructed actuator portion 34, the displacement adjusting layers 60 having a suitable pattern are formed integrally on the portions of the outer surface of the closure plate 56 which are aligned with the respective dummy cavities 37, whereby the rigidity at the two outermost pressure chambers 36 which has been lowered due to the provision of the dummy cavities 37 are suitably increased as desired. Thus, the dummy cavities 37 and the displacement adjusting layers 60 cooperate with each other to adjust the rigidity at the two outermost pressure chambers 36, consequently the amount of deformation thereof so that all of the four P/E elements 70, in other words, the four pressure chambers 36 undergo substantially the same amount of displacement so as to assure improved operating characteristics of the actuator portion 34 of the actuator unit 30 with high stability. Upon firing the P/E elements 70 formed on the closure plate 56, the elements 70 may suffer from thermal stresses due to thermal contraction generated while the piezoelectric and/or electrostrictive material for the elements 70 is sintered and densified. The elements 70 may further suffer from thermal stresses caused due to a difference in coefficients of thermal expansion between the piezoelectric and/or electrostrictive material and the ceramic material for the closure plate 56 partially defining the pressure chambers 36. These stresses undesirably deteriorate the operating characteristics of the two outermost P/E elements 70. However, in the present actuator portion 34 wherein the dummy cavities 37 corresponding to the auxiliary windows 78 are formed within the ceramic substrate 64, the deterioration of the operating characteristics in the two outermost elements 70 is advantageously eliminated or reduced.

Further, in the present actuator portion 34 constructed as described above, the rigidity at the two outermost pressure chambers 36 located at the opposite ends of the row of the chambers 36 can be finely and precisely adjusted by varying the pattern of the displacement adjusting layers 60. This arrangement is advantageous in view of the required cost and time for adjusting the rigidity at the two outermost pressure chambers 36 over the conventional arrangement wherein the rigidity is adjusted by changing the configuration (size and shape) of the auxiliary windows 78 (dummy cavities 37). Described in detail, in the present arrangement, the rigidity at the two outermost pressure chambers 36 formed adjacent to the respective dummy cavities 37 is suitably adjusted by providing the displacement adjusting layers 60 on the portions of the outer surface of the closure plate 56 which are aligned with the respective dummy cavities 37. Further, the rigidity can be adjusted as desired by changing the pattern of the displacement adjusting layers 60, whereby the manufacturing cost of the actuator is effectively reduced. The modification of the pattern of the displacement adjusting layers 60 can be effected at a lower cost in a shorter time, than in the case where the rigidity is adjusted by changing the size and shape of the auxiliary windows 78 using various kinds of metal molds for punching operation. Thus, the present arrangement permits easy and economical initial design of the actuator and subsequent modifications of the design.

Figure 3:
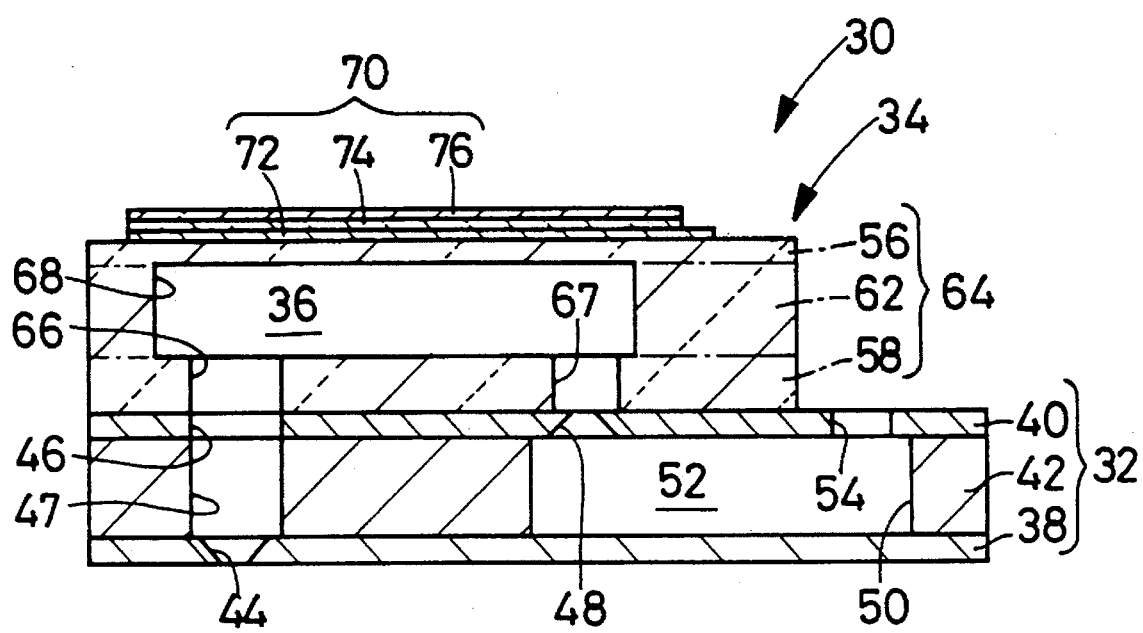
FIG. 3 is an elevational view in vertical cross section, showing the actuator unit including the actuator portion of FIG. 1, which actuator unit is used as an ink pump for an ink jet print head.

The actuator portion 34 as described above can be used for each of ink pumps or actuator units used in an ink jet print head, for instance. Referring to FIG. 3 schematically showing the actuator unit 30 constructed according to the present invention, wherein the above-indicated ink nozzle member 32 and the actuator portion 34 as described above are bonded together to provide an integral structure of the actuator unit 30. As shown in FIG. 4, the ink nozzle member 32 consists of a nozzle plate 38 and an orifice plate 40 both having a relatively small thickness, and a channel plate 42 interposed between these plates 38, 40. The nozzle plate 38 and the orifice plate 40 are integrally bonded to the channel plate 42 by means of an adhesive.

More specifically described, the orifice plate 40 of the ink nozzle member 32 has through-holes 46 and orifices 48 formed through the thickness thereof. The through-holes 46 and the orifices 48 are respectively aligned with the first communication holes 66 and the second communication holes 67 of the connecting plate 58 of the actuator portion 34. The orifice plate 40 further has a supply port 54 through which an ink is fed into an ink supply channel 52 which will be described. The channel plate 42 has through-holes 47 formed in alignment with the respective through-holes 46 of the orifice plate 40. The channel plate 42 is formed with a window 50 which communicates with the orifices 48 and the supply port 54 of the orifice plate 40. The nozzle plate 38 has nozzles 44 formed through the thickness thereof for permitting jets of fine ink particles. The nozzles 44 are aligned with the respective through-holes 47 of the channel plate 42.

The nozzle plate 38, orifice plate 40, and channel plate 42 are superposed on each other and bonded together by a suitable adhesive, so as to form an integral structure of the ink nozzle member 32. In the thus formed ink nozzle member 32, the window 50 of the channel plate 42 is closed at its opposite openings by the nozzle plate 38 and the orifice plate 40, respectively, whereby the above-indicated ink supply channel 52 is defined by the channel plate 42, nozzle plate 38, and orifice plate 40.

While the material for these plates 38, 40, 42 of the ink nozzle member 32 is not particularly limited, these plates 38, 40, 42 are preferably made of a plastic or a metal such as nickel or stainless steel, which permits the nozzles 44 and orifices 48 to be formed in the respective nozzle and orifice plates 38, 40 with high accuracy. Each of the orifices 48 is desirably formed in a tapered shape as shown in FIG. 3, for instance, such that the diameter of the orifice 48 is reduced in the direction of the flow of the ink (i.e., in the direction from the ink supply channel 52 toward the pressure chamber 36), so as to function as a check valve for inhibiting the the ink from flowing in the reverse direction.

The thus constructed ink nozzle member 32 is integrally bonded to the actuator portion 34 as described above by using a suitable adhesive so as to provide each of many actuator units 30 of the ink jet print head. In the thus formed actuator unit 30, the ink material which is fed into the supply channel 52 through the supply port 54 is supplied to the pressure chambers 36 of the actuator portion 34 through the respective orifices 48 of the orifice plate 40 of the ink nozzle member 32, and is passed through selected pairs of the through-holes 46, 47 and jetted outwards from the corresponding nozzles 44, upon operation of the corresponding P/E elements 70 of the actuator portion 34.

While the adhesive used for bonding the ink nozzle member 32 and the actuator portion 34 is not particularly limited, the adhesive may be selected from various known adhesives containing any one of vinyl, acryl, polyamide, phenol, resorcinol, urea, melamine, polyester, epoxy, furan, polyurethane, silicone, rubber, polyimide and polyolefin, as long as the selected adhesive is resistant to the ink material when the actuator unit 30 obtained by bonding the ink nozzle member 32 and the actuator portion 34 is used as the ink pump in the ink jet print head.

It is desirable in terms of production efficiency that the adhesive be in the form of a highly viscous paste or in the form of a sheet. It is more desirable to use a hot-melt type adhesive which requires relatively short heating time, or an adhesive which is curable at room temperature. It is particularly preferable to use an elastic epoxy adhesive, a silicone-contained adhesive or an epoxy-type adhesive containing silicone resin which can be applied by screen-printing, or a sheet-like, hot-melt type adhesive containing polyolefin or polyester which permits punching of the adhesive sheet.

In the thus constructed actuator unit 30, the actuator portion 34 stably exhibits improved operating characteristics as described above so as to assure enhanced performance seven elements 70 which correspond to the respective seven pressure chambers 36, the amount of flexural deformation was measured of each of the seven pressure chambers 36 (Nos. 1–7), by using a laser Doppler measuring device. As comparative examples, two kinds of actuator portions were prepared. One of these actuator portions (indicated by "II" in the following TABLE 1) has seven pressure chambers 36 formed within the substrate in a row while the auxiliary windows 78 as provided in the actuator portion 34 of the present invention are not formed in the spacer plate 62. The other actuator portion (indicated by "I" in the TABLE 1) has two auxiliary windows 78 formed in the spacer plate 62 and the corresponding two dummy cavities 37 formed within the substrate 64, in addition to seven pressure chambers 36, so that the two dummy cavities 37 sandwich the row of the seven pressure chambers 36. However, this actuator portion is not provided with the displacement adjusting layers 60 corresponding to the respective dummy cavities 37, unlike the actuator portion 34 of the present invention. The amount of flexural deformation was similarly measured of each of the seven pressure chambers 36 (Nos. 1–7), by applying a given voltage to the corresponding P/E elements 70 in each of the actuator portions of the comparative examples I, II. The results of measurement are indicated in the following TABLE 1. It is noted that the configuration of the auxiliary windows 78 was made identical with that of the windows 68 in both the actuator portion 34 of the present invention and the actuator portion of the comparative example I.

TABLE 1

|  | dummy cavities (37) | displacement adjusting layers (60) | Amounts of flexural displacement (μm) of pressure chambers upon application of voltage to the corresponding piezoelectric/ electrostrictive element pressure chamber No. | | | | | | |
|---|---|---|---|---|---|---|---|---|---|
|  |  |  | 1 | 2 | 3 | 4 | 5 | 6 | 7 |
| actuator portion 34 of the present invention | provided | provided | 0.25 | 0.26 | 0.25 | 0.27 | 0.26 | 0.26 | 0.26 |
| actuator portion of the comparative example I | provided | not provided | 0.28 | 0.26 | 0.25 | 0.25 | 0.26 | 0.26 | 0.29 |
| actuator portion of the comparative example II | not provided | not provided | 0.19 | 0.25 | 0.26 | 0.25 | 0.27 | 0.26 | 0.20 | thereof as an ink pump, whereby the present print head actuator unit 30 offers excellent ink-jetting capability with high stability.

A sample of the actuator portion 34 illustrated in FIGS. 1 and 2 was prepared, wherein seven pressure chambers 36 (Nos. 1–7) are formed within the ceramic substrate in a row, and two enclosed spaces or dummy cavities 37 in alignment with the respective two auxiliary windows 78 are formed within the substrate adjacent to the respective two outermost pressure chambers 36 (No. 1 and No. 7) which are located at opposite ends of the row of the seven pressure chambers 36. The actuator portion 34 further has displacement adjusting layers 60 formed integrally on the portions of the outer surface of the closure plate 56 which are aligned with the respective dummy cavities 37, by a known film-forming method at the same time when the P/E elements 70 were formed on the outer surface of the closure plate 56 in alignment with the respective seven pressure chambers 36. Each of the displacement adjusting layers 60 consists of two layers which are similar to the lower electrode 72 and the P/E layer 74, respectively. By applying a given voltage to the As clearly understood from the results indicated in the above TABLE 1, in the present actuator portion 34 wherein the dummy cavities 37 corresponding to the respective auxiliary windows 78 are formed adjacent to the respective two outermost pressure chambers 36 and the displacement adjusting layers 60 are formed on the outer surface of the closure plate 56 so as to be aligned with the respective dummy cavities 37, the amounts of flexural deformation of the two outermost pressure chambers 36 (No. 1 and No. 7) upon actuation of the corresponding two outermost P/E elements 70 were substantially equal to those of the five inner chambers (Nos. 2–6) interposed between the two outermost chambers 36. Therefore, the actuator portion constructed according to the present invention ensures improved operating characteristics with high stability. In contrast, in the actuator portion of the comparative example II wherein neither the dummy cavities 37 nor the displacement adjusting layers 60 were provided, the amounts of flexural deformation of the two outermost pressure chambers (No. 1 and No. 7) upon actuation of the corresponding P/E elements 70 were considerably small, deteriorating the operating characteristics of the actuator portion. In the actuator portion of the comparative example I wherein the displacement adjusting layers 60 were not formed on the outer surface of the closure plate 56 corresponding to the respective dummy cavities 37, the amounts of flexural deformation of the two outermost chambers (No. 1 and No. 7) were undesirably too large because the rigidity at these two chambers was excessively lowered due to inadequately selected size of the auxiliary windows 78 (dummy cavities 37). In the actuator portion of the comparative sample II, too, the operating characteristics thereof were unfavorably fluctuated.

While the present invention has been described in detail in its preferred embodiment with a certain degree of particularity, it is to be understood that the invention is not limited to the details of the illustrated embodiment but may be otherwise embodied with various changes, modifications and improvements without departing from the spirit and scope of the invention defined in the appended claims.

For instance, the construction of the actuator unit 30 or actuator portion 34 is by no means limited to that of the illustrated embodiment. Various other known constructions may be equally employed in the present actuator unit 30 or actuator portion 34. The configurations, positions, numbers and other parameters of the pressure chambers 36 and the P/E elements 70 in the actuator portion 34 are not limited to those of the illustrated embodiment, but may be suitably selected depending upon the utility or application of the actuator portion 34 of the actuator unit 30 provided that the pressure chambers 36 are formed within the substrate in a row, so as to be sandwiched by and between the dummy cavities 37 corresponding to the auxiliary windows 78. In the illustrated embodiment, although the two auxiliary windows 78 which give the dummy cavities 37 are formed adjacent to the respective two outermost pressure chambers 36 located at the opposite ends of the row, two or more auxiliary windows may be formed adjacent to each of the two outermost pressure chambers 36. In this case, one or more displacement adjusting layers 60 is/are formed on the outer surface of the closure plate 56, for each of the two or more auxiliary windows 78 which are provided adjacent to each outermost pressure chamber 36.

The actuator unit constructed according to the present invention may be used as an ink pump for various ink jet print heads other than the described above, and may also be used for microphones, piezoelectric loudspeakers, sensors, vibrators or resonators, filters and other components or devices.

What is claimed is:

1. A piezoelectric and/or electrostrictive actuator comprising (a) a ceramic substrate in which pressure chambers are formed in a row extending in a longitudinal direction of said substrate, said ceramic substrate including a spacer plate having a plurality of windows which provide said pressure chambers, said plurality of windows being formed in a row extending in a longitudinal direction of said spacer plate, a closure plate superposed on one of opposite major surfaces of said spacer plate so as to close one of opposite openings of each of said windows, and a connecting plate superposed on the other major surface of said spacer plate so as to close the other opening of each of said windows, said spacer plate, said closure plate and said connecting plate being formed from respective ceramic green sheets which are laminated on each other and fired into an integral structure as said ceramic substrate, and (b) piezoelectric and/or electrostrictive elements which are disposed on respective portions of an outer surface of said closure plate which partially define said pressure chambers, respectively, said elements being energized to cause deformation of said respective portions, so as to change pressure levels of the corresponding pressure chambers, each of said piezoelectric and/or electrostrictive elements comprising a lower electrode, a piezoelectric and/or electrostrictive layer and an upper electrode which are formed in the order of description by a film-forming method on the outer surface of said closure plate in alignment with the respective pressure chambers, wherein the improvement comprises:

said spacer plate having auxiliary windows having a predetermined size formed adjacent to respective two outermost windows which are located at opposite ends of the row of said plurality of windows of said spacer plate, said auxiliary windows providing dummy cavities within said ceramic substrate such that said dummy cavities are formed adjacent to respective two outermost pressure chambers which are located at opposite ends of said row of said pressure chambers; and displacement adjusting layers having a suitable pattern which are integrally formed on respective portions of the outer surface of said closure plate which are aligned with said auxiliary windows of said spacer plate.

2. A piezoelectric and/or electrostrictive actuator according to claim 1, wherein said displacement adjusting layers are integrally formed by a film-forming method on said respective portions of the outer surface of said closure plate.

3. A piezoelectric and/or electrostrictive actuator according to claim 1, wherein each of said displacement adjusting layers includes at least one layer similar to said lower electrode and/or said piezoelectric and/or electrostrictive layer, said displacement adjusting layers being formed on said respective portions of the outer surface of said closure plate, at the same time when said piezoelectric and/or electrostrictive elements are formed on said closure plate.

4. A piezoelectric and/or electrostrictive actuator according to claim 1, wherein each of said displacement adjusting layers includes a layer similar to said upper electrode.

5. A piezoelectric and/or electrostrictive actuator according to claim 1, wherein each of said displacement adjusting layers includes an insulating resin layer comprised of an electrically insulating resin material.

6. A piezoelectric and/or electrostrictive actuator according to claim 1, wherein each of said displacement adjusting layers has a thickness of not larger than 70 μm.

7. A piezoelectric and/or electrostrictive actuator according to claim 5, wherein said insulating resin material has Young's modulus in a range of 1 kg/mm$^2$–1000 kg/mm$^2$.

8. A piezoelectric and/or electrostrictive actuator according to claim 5, wherein said insulating resin material includes a thermosetting resin such as acrylic resin or epoxy resin.

9. A piezoelectric and/or electrostrictive actuator according to claim 5, wherein said insulating resin material includes a solder resist.

10. A piezoelectric and/or electrostrictive actuator according to claim 1, wherein said ceramic substrate is comprised of alumina or zirconia.

11. A piezoelectric and/or electrostrictive actuator according to claim 1, wherein said closure plate has a thickness of not larger than 50 μm.

12. A piezoelectric and/or electrostrictive actuator according to claim 1, wherein said spacer plate has a thickness of not smaller than 10 μm.

13. A piezoelectric and/or electrostrictive actuator according to claim 1, wherein said connecting plate has a thickness of not smaller than 30 μm.

14. A piezoelectric and/or electrostrictive actuator according to claim 1, wherein said piezoelectric and/or electrostrictive element has a thickness of not larger than 100 μm.

15. A piezoelectric and/or electrostrictive actuator according to claim 1, wherein each of said upper and lower electrodes has a thickness of not larger than 20 μm.

16. A piezoelectric and/or electrostrictive actuator according to claim 1, wherein said piezoelectric and/or electrostrictive layer has a thickness of not larger than 50 μm.

17. A piezoelectric and/or electrostrictive actuator according to claim 1, which is used as an actuator unit of an ink jet print head, and which further comprises an ink nozzle member including an orifice plate having orifices and through-holes, a channel plate having a window formed therethrough and through-holes formed in alignment with said through-holes of said orifice plate, and a nozzle plate having nozzles, said orifice plate, said channel plate and said nozzle plate being superposed on each other and bonded together so that said window of said channel plate is closed by said orifice plate and said nozzle plate so as to form an ink supply channel through which an ink flows into said pressure chambers of said actuator via the respective orifices of said orifice plate, said ink being jetted from said pressure chambers through said nozzles of said nozzle plate, via said through-holes of said orifice plate and said channel plate, when said elements corresponding to said pressure chambers are selectively energized.

* * * * *

UNITED STATES PATENT AND TRADEMARK OFFICE
CERTIFICATE OF CORRECTION

PATENT NO. : 5,512,793
DATED : April 30, 1996
INVENTOR(S) : Yukihisa Takeuchi et al.

It is certified that error appears in the above-indentified patent and that said Letters Patent is hereby corrected as shown below:

Title page , item [73] after "Japan" add --and SEIKO EPSON CORPORATION, Japan--.

Signed and Sealed this

Twenty-first Day of January, 1997

Attest:

BRUCE LEHMAN

*Attesting Officer*  *Commissioner of Patents and Trademarks*